(12) United States Patent
Song et al.

(10) Patent No.: US 7,914,332 B2
(45) Date of Patent: Mar. 29, 2011

(54) SELF-LOCKING ELECTRONIC CIRCUIT CARD MOUNTING ASSEMBLIES AND METHODS

(75) Inventors: Seaho Song, Kanata (CA); Wayne Wink, Carp (CA); Christopher Michael Gorman, Ottawa (CA); Donald Michael Douglas Locke, Smiths Falls (CA)

(73) Assignee: Ross Video | Live Production Technology, Nepean, Ontario (CA)

( * ) Notice: Subject to any disclaimer, the term of this patent is extended or adjusted under 35 U.S.C. 154(b) by 0 days.

(21) Appl. No.: 12/549,865

(22) Filed: Aug. 28, 2009

(65) Prior Publication Data

US 2011/0053423 A1  Mar. 3, 2011

(51) Int. Cl.
*H01R 24/00* (2006.01)
(52) U.S. Cl. .................................................. 439/629
(58) Field of Classification Search .................. None
See application file for complete search history.

(56) References Cited

U.S. PATENT DOCUMENTS

| | | | |
|---|---|---|---|
| 6,535,397 B2 | 3/2003 | Clark et al. | |
| 6,822,874 B1 | 11/2004 | Marler | |
| 7,031,171 B2 | 4/2006 | Marcotte et al. | |
| 7,510,410 B2 * | 3/2009 | Lin et al. | 439/135 |
| 7,727,000 B2 * | 6/2010 | Minich | 439/377 |
| 2005/0177662 A1 | 8/2005 | Hauke et al. | |
| 2006/0141847 A1 | 6/2006 | Ngo | |

OTHER PUBLICATIONS

U.S. Appl. No. 12/436,393, filed May 6, 2009 Weidner et al.*

* cited by examiner

*Primary Examiner* — Chandrika Prasad
(74) *Attorney, Agent, or Firm* — Nixon Peabody LLP; Jeffrey L. Costellia

(57) ABSTRACT

Electronic circuit card mounting assemblies and methods are disclosed. An electronic circuit card and an electronic equipment system include mating connectors to operatively couple the circuit card to the equipment system. The circuit card and the equipment system also include respective mating elements of a mounting assembly that engage each other to releasably mount the electronic circuit card to the electronic equipment system. The connectors and the elements of the mounting assembly are positioned to releasably hold the connectors in an operative position when the circuit card is mounted to the equipment system. Related methods of manufacturing electronic circuit cards and equipment systems are also provided. In one embodiment, the mounting assembly elements include a key and a socket to receive the key, and the key and the socket control one or more of a circuit card insertion force, a circuit card retention force, and a circuit removal force.

26 Claims, 4 Drawing Sheets

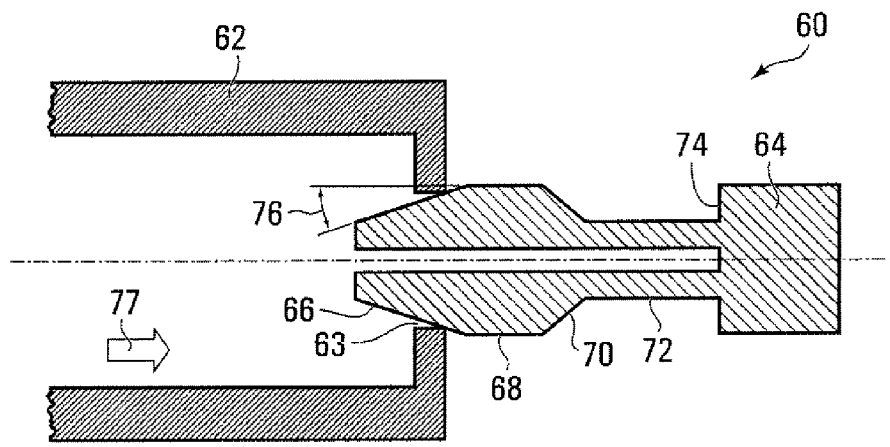
FIG. 3
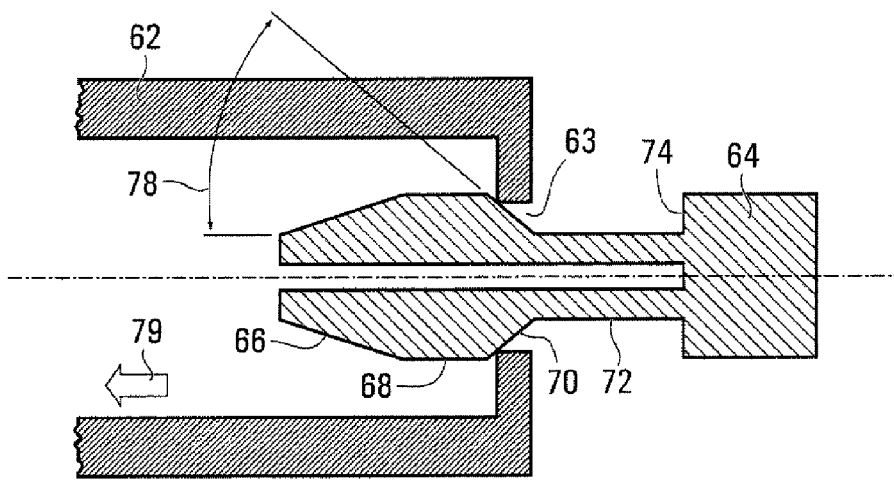
FIG. 4
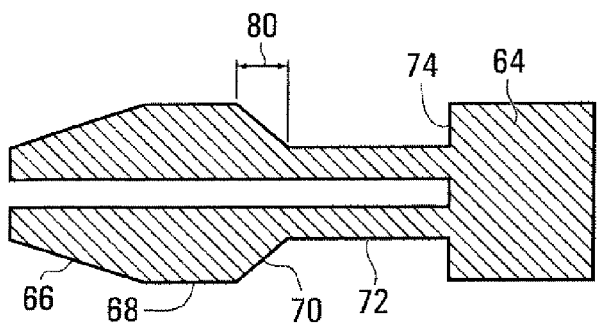 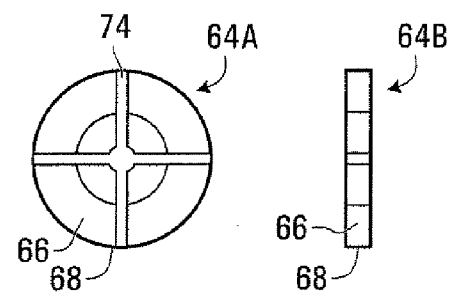
FIG. 5  FIG. 6A  FIG. 6B

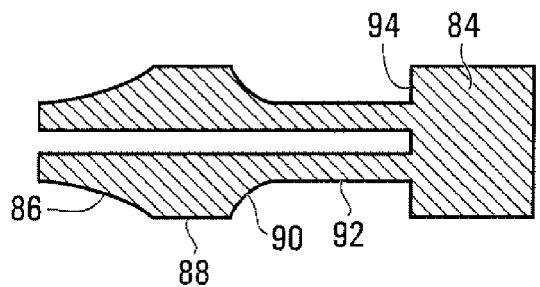
FIG. 7
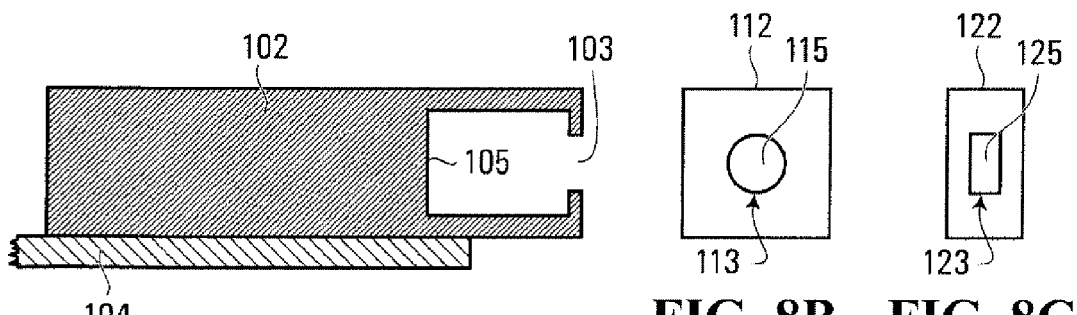
FIG. 8A  FIG. 8B  FIG. 8C
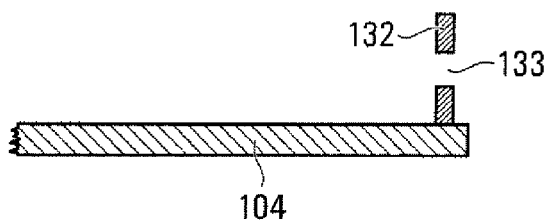
FIG. 9
   
FIG. 10A  FIG. 10B  FIG. 10C  FIG. 10D

SELF-LOCKING ELECTRONIC CIRCUIT CARD MOUNTING ASSEMBLIES AND METHODS

FIELD OF THE INVENTION

This invention relates generally to electronic equipment and, in particular, to mounting electronic circuit cards to such equipment.

BACKGROUND

Electronic equipment systems, such as rack-mounted video equipment for example, often contain electronic circuit cards which are inserted at the front of a frame. The rear of the frame is typically densely populated with cables, making it difficult to access for operations other than cable connections. This necessitates the blind-mating of connector(s) on the circuit cards and mating receptacles or connectors on a distribution mid-plane or a rear module with cable terminations, for instance.

Connectors such as butt-contact fiber connectors require a compressive force to be sustained within a certain range. Some systems rely on mating of electrical connector(s) on a circuit card and their receptacles to hold fiber connectors in connection with their mating fiber receptacles. However, in these types of systems it can be difficult to control forces of card insertion and/or removal. Also, in order to have more fiber connectors, more electrical connectors are needed just as a mechanical fixture.

Other currently available systems involve implementing mechanical latch designs, which tend to require high part counts and can be subject to complexity in design due to frame system-level mechanical tolerances.

SUMMARY

According to an embodiment of the invention, an electronic circuit card includes a connector to operatively couple the electronic circuit card to an electronic equipment system, and a first element of a mounting assembly to engage a second element of the mounting assembly associated with the electronic equipment system to releasably mount the electronic circuit card to the electronic equipment system. The connector and the first element of the mounting assembly are positioned on the electronic circuit card to releasably hold the connector in an operative position relative to a mating connector of the electronic equipment system when the electronic circuit card is mounted to the electronic equipment system.

The electronic equipment system includes a rack-mountable frame system to house and interconnect one or more electronic circuit cards in one embodiment.

The connector might include one or more optical connectors, one or more electrical connectors, or both one or more optical connectors and one or more electrical connectors.

In some embodiments, the electronic circuit card also includes a first element of each of one or more additional mounting assemblies to engage a second element of each of the one or more additional mounting assemblies associated with the electronic equipment system.

One possible implementation of the mounting assembly includes a key and a socket to receive the key, in which case one of the first element of the mounting assembly and the second element of the mounting assembly includes the key, and the other of the first element of the mounting assembly and the second element of the mounting assembly includes the socket. The key and the socket may control one or more of a force to mount the electronic circuit card to the electronic equipment system, a force to dismount the electronic circuit card from the electronic equipment system, and/or a contact force between the connector and the mating connector while the electronic circuit card is mounted to the electronic equipment system.

Another aspect of the invention relates to an electronic equipment system to receive one or more electronic circuit cards. The electronic equipment system includes a connector to operatively couple the electronic equipment system to an electronic circuit card, and a first element of a mounting assembly to engage a second element of the mounting assembly on the electronic circuit card to releasably mount the electronic circuit card to the electronic equipment system. The connector and the first element of the mounting assembly are positioned in the electronic equipment system to releasably hold the connector in an operative position relative to a mating connector of the electronic circuit card when the electronic circuit card is mounted to the electronic equipment system.

The electronic equipment system might include a rack-mountable frame system to house and interconnect the one or more electronic circuit cards.

In some embodiments, the connector includes one or more optical connectors and/or one or more electrical connectors.

Multiple mounting assemblies could be provided. In this case, the electronic equipment system might also include a first element of each of one or more additional mounting assemblies to engage a second element of each of the one or more additional mounting assemblies. The second element of each additional mounting assembly could be provided on the same electronic circuit card. The mounting assemblies might also or instead include respective additional mounting assemblies on one or more additional electronic circuit cards.

The electronic equipment system might include a frame structure to receive the one or more electronic circuit cards, and a further component of the electronic equipment system which is separable from the frame structure. The frame structure or the further component could include the first element of the mounting assembly.

In a complete implementation, the electronic equipment system also includes the electronic circuit card.

According to another aspect of the invention, a method includes providing an electronic circuit card, providing a connector on the electronic circuit card to operatively couple the electronic circuit card to an electronic equipment system, and providing a first element of a mounting assembly on the circuit card to engage a second element of the mounting assembly associated with the electronic equipment system to releasably mount the electronic circuit card to the electronic equipment system. Providing the connector and providing the first element of the mounting assembly involve positioning the connector and the first element of the mounting assembly on the electronic circuit card to releasably hold the connector in an operative position relative to a mating connector of the electronic equipment system when the electronic circuit card is mounted to the electronic equipment system.

As noted above, the mounting assembly might include a key and a socket to receive the key, and in this case providing the first element of the mounting assembly involves providing one of the key and the socket on the electronic circuit card.

A method could also include mounting the electronic circuit card to the electronic equipment system.

A further aspect of the invention provides a method that includes providing an electronic equipment system to receive one or more electronic circuit cards, providing a connector in the electronic equipment system to operatively couple the electronic equipment system to an electronic circuit card, and providing a first element of a mounting assembly in the electronic equipment system to engage a second element of the mounting assembly on the electronic circuit card to releasably mount the electronic circuit card to the electronic equipment system. Providing the connector and providing the first element of the mounting assembly involve positioning the connector and the first element of the mounting assembly in the electronic equipment system to releasably hold the connector in an operative position relative to a mating connector of the electronic circuit card when the electronic circuit card is mounted to the electronic equipment system.

Where the mounting assembly includes a key and a socket to receive the key, and providing the first element of the mounting assembly involves providing one of the key and the socket in the electronic equipment system.

Such a method might also involve mounting the electronic circuit card to the electronic equipment system.

Other aspects and features of embodiments of the present invention will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 3 is a cross-sectional view of an example mounting assembly having a socket and a key.

FIG. 4 is a cross-sectional view of the example mounting assembly in FIG. 3 in a mounted position.

FIG. 5 is a cross-sectional view of a key of the example mounting assembly of FIG. 3.

FIGS. 6A and 6B are end views of example keys having the profile shown in FIG. 5.

FIG. 7 is a cross-sectional view of another example of a mounting assembly key.

FIG. 8A is a cross-sectional view of an example of a mounting assembly socket.

FIGS. 8B and 8C are end views of example mounting assembly sockets.

FIG. 9 is a cross-sectional view of yet another example of a mounting assembly socket.

FIGS. 10A through 10D are cross-sectional views illustrating example profiles for a mounting assembly socket opening.

DETAILED DESCRIPTION

Embodiments of the present invention relate to electronic equipment systems, including but in no way limited to broadcast video equipment. In one possible application, the embodiments disclosed herein might be implemented in a rack-mounted frame system that houses replaceable electronic circuit cards with blind-mate optical fiber connectors. For example, in a frame architecture that houses electronic circuit cards, the electronic circuit cards might contain blind-mate optical fiber connectors requiring sustained compressive force of controlled magnitude, together with traditional electrical card-edge connectors. As described in detail below, one or more sockets could be provided on an electronic circuit card to mate to keys fastened to a rear module which in turn is mounted on the rear side of the frame. A profile of the key and/or a profile of the socket might be tailored to enable the electronic circuit card to be inserted, self-locked for retention, and removed at controlled forces. This type of architecture allows frame designs with high fiber connector density at low mechanical part counts, and also enables highly repeatable insertion/removal operations.

Figure 1:
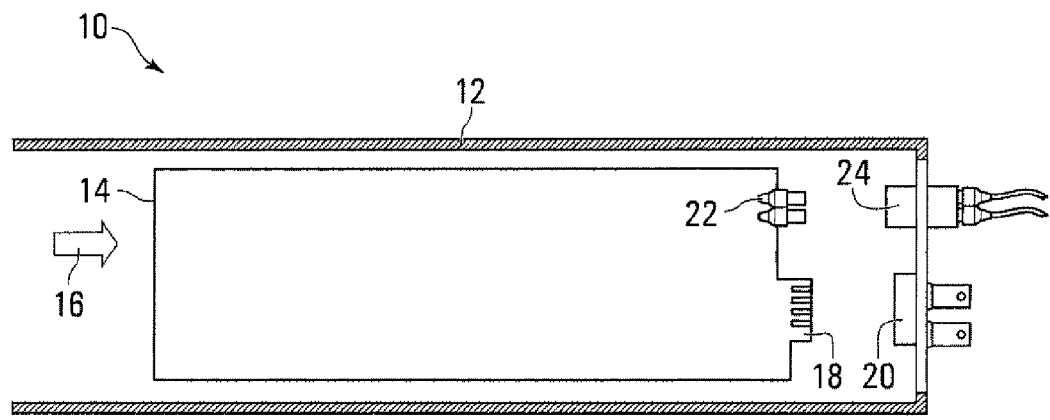
FIG. 1 is a block diagram of an electronic equipment system.

FIG. 1 is a block diagram illustration of an electronic equipment system 10, having a frame 12 and removable circuit cards, one of which is shown at 14. The circuit card 14 has electrical and optical or fiber connectors 18, 22, that are blind-mateable to their counterpart connectors 20, 24 at the rear of the frame 12. The connectors 20, 24 at the rear of the frame 12 are terminating connectors (fiber or electrical), either directly on the frame 12 as shown, on a mid-plane, or on a rear PCB.

A circuit card 14 being inserted into the frame 12 in the insertion direction 16 has both the electrical connectors 18 and the optical connectors 22 being blind-mated. The insertion comes to an end when a hard stop occurs in some part of either connector 18/20, 22/24. The fiber connectors 22, 24 push against each other and are held in position by the grabbing forces of the electrical connectors 18/20. Therefore, the integrity of the fiber connection between the connectors 22, 24 relies totally on the nature of the electrical connection. The electrical connection thus also functions as a clamping mechanism for the fiber connectors 22, 24, and accordingly it can be difficult to provide proper force control for insertion, retention, and extraction. Fiber connector density at the edge of the circuit card 14, and therefore also for the frame 12, is reduced due to the presence of the electrical connector 18 and the fact that implementing a higher number of fiber connectors 22, 24 may require additional electrical connectors 18, just to provide sufficient force to properly hold the fiber connectors in contact with each other.

Figure 2:
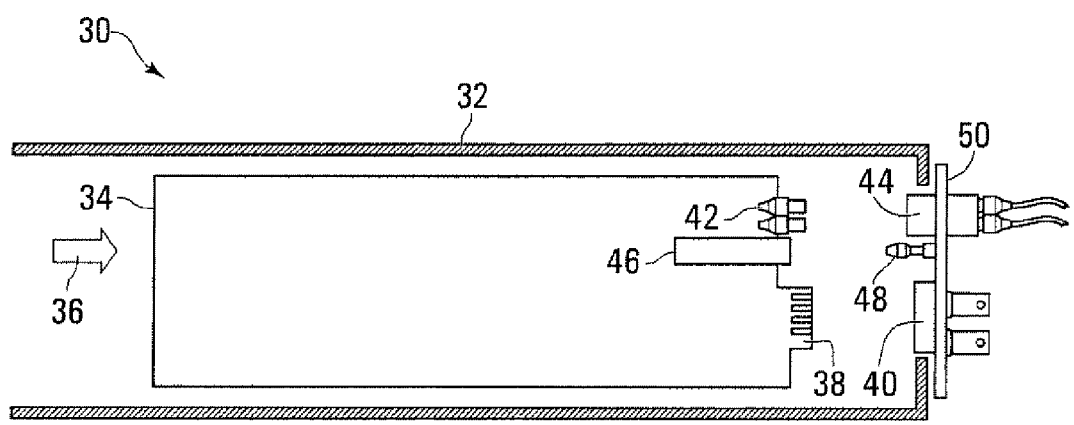
FIG. 2 is a block diagram of an example electronic equipment system according to an embodiment of the invention.

FIG. 2 is a block diagram of an example electronic equipment system 30 according to an embodiment of the invention. The example system is a frame system which includes a rack-mountable frame 32, one or more brackets or rear module assemblies 50, and one or more circuit cards 34 insertable into the frame in the insertion direction 36. The rear module assembly 50 includes connectors in the form of receptacles 40, 44 for electrical and fiber connectors 38, 42 on the circuit card 34, and one or more self-locking keys 48. The circuit card 34 in the example shown includes one or more self-locking sockets 46. The example system 30 in FIG. 2 differs from the system 10 illustrated in FIG. 1 in that the self-locking key(s) 48 and socket(s) 46 provide active control of the forces for insertion, retention, and removal of the circuit card 34.

FIG. 3 is a cross-sectional view of an example mounting assembly 60 having a socket 62 and a key 64. In FIG. 3, the mounting assembly socket 62 is being forced over the key 64, as indicated at 77. This represents an example of a circuit card insertion and illustrates the interaction between the self-locking key 64 and the socket 62.

As a circuit card to which the socket 62 is attached is inserted into a frame to which the key 64 is attached, a hole or opening 63 in the self-locking socket is forced over the key, which in the example shown has a larger diameter at 68 than the socket. The slope (angle 76) of the front-end surface 66 of the self-locking key 64 plays a role in defining the total insertion force required to insert the circuit card into the frame. The angle 76 is thus one design parameter that can be varied to control the required insertion force. Other parameters controlling the insertion forces include the diameter of the socket hole 63, material type of the socket 62, the diameter of the key head at 68, the diameter of the key head at the leading end of surface 66, material type of the key 64, and base diameter at 72. Any one or more of these parameters can be used to provide a desired insertion force.

The surface 74 of the key 64 represents an example of a stop surface to limit the distance by which a circuit card can be inserted into a frame.

FIG. 4 is a cross-sectional view of the example mounting assembly in FIG. 3 in a mounted position, and during circuit card removal in the removal direction 79. As the circuit card to which the socket 62 is attached is pulled away from the frame to which the key 64 is attached, the hole 63 in the self-locking socket rides over the rear side 70 of the key. The force to overcome the slope with angle 78 defines the force required to remove or dismount the circuit card from the frame. Until the removal force is applied in the removal direction 79, the key 64 and the socket 62 remain "locked" together, and the circuit card remains mounted to the frame.

The slope of the surface 70 (angle 78) can be different from the slope of the surface 66 (angle 76), to define different insertion and removal forces if desired. This can be useful in providing operators or other personnel with tactile feedback during circuit card insertion and removal.

As noted above in respect of insertion force, other parameters than the angle 78 may control the removal force. These include the diameter of the socket hole 63, material type of the socket 62, the diameter of the key head at 68, the base diameter at 72, and material type of the key 64.

FIG. 5 is another cross-sectional view of the example key 64, and shows a rear slope distance 80 of the self-locking key. The rear slope distance 80 of the surface 70 defines a range of the active locked-in position of the key 64 in one embodiment. This distance 80 can be adjusted to accommodate any of various levels of mating position uncertainty due to system tolerances. For example, a longer rear slope distance 80 could be used to maintain a certain force for allowing a circuit card to be held in any particular position while the slope 70 remains in contact with the socket hole 63 (FIGS. 3 and 4). Another possible option would be to provide a base diameter of the key 64 at 72 which is larger than the socket hole 63, which would also maintain a frictional force between the socket 62 and the key in a range of mounted positions in which a circuit card is mounted to a frame or other electronic equipment system.

The rear slope distance 80, the size of the socket hole 63, the base diameter of the key 64 at 72, and the distance between where edges of the socket hole contact the surface 70 and the surface 74 can thus be varied to determine a tolerance of the positioning of a circuit card relative to an electronic equipment system. This can be important, for example, to ensure that optical connectors or fibers touch at a correct mating force for long term reliability.

The description above refers to a mounting assembly socket and key. It should be appreciated, however, that these terms are intended solely to convey an understanding of one possible embodiment of the invention, and are not to be limited to a narrow interpretation. These terms are used herein in a broad sense, and should be interpreted to encompass mating female and male elements, wherein one element receives and releasably retains the other.

A mounting assembly key may take any of various shapes. The cross-sectional views in FIGS. 3 to 5 illustrate an example profile of the key 64 which is received in a slot or hole 63 in the socket 62. Examples of key implementations are shown in FIGS. 6A and 6B, and other key shapes are also contemplated.

For instance, FIG. 6A is an end view of an example key having the profile shown in FIGS. 3 to 5. In this example, the key 64A is substantially cylindrical, the head of the key has four legs, and the surfaces 66 and 68 are visible in the view shown in FIG. 6A. Between adjacent legs, the surface 74 is visible. The dimensions and material of the legs control flexing of the legs and thus provide further parameters for controlling insertion, retention, and removal forces. FIG. 6B is an end view of another example of a key 64B which is substantially flat but also has the profile shown in FIGS. 3 to 5. The example key 64B has only two legs, and the surfaces 66 and 68 are visible in the illustrated view.

FIG. 7 is a cross-sectional view of another example of a mounting assembly key 84. The surfaces 86, 88, 90, 92, 94 of the example key 84 are analogous to the surfaces 66, 68, 70, 72, 74 of the example key 64. However, in the example key 84, the surfaces 86, 90 are curved. Curved surfaces can provide not only certain levels of insertion or removal forces, but also particular variations in such forces dependent on insertion/removal position.

Variations in mounting assembly sockets are also possible. FIG. 8A is a cross-sectional view of an example of a mounting assembly socket including a body 102 which is attached to a circuit card 104 and an opening 103 which may but need not necessarily extend beyond an edge of the circuit card. A surface 105 may be provided to limit a depth of insertion of a corresponding key. The body 102 might be useful, for example, to accommodate fasteners for attaching the socket to the circuit card 104.

FIGS. 8B and 8C are end views of example mounting assembly sockets. In FIG. 8B, the socket hole 113 is provided at an end of a socket body 112 to receive a socket key. The surface 115 may be used to limit the insertion distance. A socket of the type shown in FIG. 8B might be used with a key having the shape shown in FIG. 6A, for example. The socket of FIG. 8C has a slot 123 at the end of the socket body 122 and might be used with a substantially flat key such as shown in FIG. 6B to conserve physical space. Again, the surface 125 may limit the insertion distance of the key. While the example shown in FIG. 8C would conserve space on a circuit card, the amount of vertical space needed to accommodate a socket could be reduced, without affecting the insertion/retention/removal forces, by providing a lower and wider socket.

Other forms of sockets include a plate type socket. FIG. 9 is a cross-sectional view such a socket, in which a socket opening 133 is provided in a substantially flat socket body 132. This type of socket could be used, for example, to reduce the amount of space that is occupied on the circuit card 104.

The actual profile of a socket opening might also or instead be varied to control insertion, retention, and/or removal forces. FIGS. 3 and 4 show flat socket opening profiles. Further examples of socket opening profiles, each of which might provide different forces, are shown in the cross-sectional views of FIGS. 10A through 10D. Other socket profiles are also contemplated.

The examples of keys and sockets as shown in the drawings and described herein are intended solely for illustrative purposes. Further variations, such as using non-smooth surfaces on one or both of a socket opening and a key, for example, may be or become apparent to those skilled in the art. For instance, roughened surfaces or surfaces that include other types of surface treatments could be used to increase insertion, retention, and/or removal forces.

Various illustrative embodiments of the invention have been described in detail above. More generally, an electronic circuit card in accordance with an embodiment of the invention may include a connector to operatively couple the electronic circuit card to an electronic equipment system, and a first element of a mounting assembly to engage a second element of the mounting assembly associated with the electronic equipment system to releasably mount the electronic circuit card to the electronic equipment system. The connector and the first element of the mounting assembly are positioned on the electronic circuit card to releasably hold the connector in an operative position relative to a mating connector of the electronic equipment system when the electronic circuit card is mounted to the electronic equipment system. An operative position for an optical connector might be a position in which the connector is held in contact with a mating connector and with a compressive force. For an electrical connector, physical contact, without necessarily maintaining a specific force, might be sufficient.

A rack-mountable frame system that houses and interconnects one or more electronic circuit cards, as described above, is one example of an electronic equipment system in conjunction with which an electronic circuit card and mounting assembly could be employed.

Although the drawings explicitly show only one mounting assembly, an electronic circuit card may include one element of each of one or more additional mounting assemblies to engage a second element of each of the one or more additional mounting assemblies associated with the electronic equipment system. An electronic circuit card could thus be releasably mounted to the electronic equipment system using multiple mounting assemblies.

The socket and key described above and shown in the drawings represent examples of first and second mounting assembly elements. In the specific examples shown in the drawings, the socket is on the electronic circuit card and the key is on the frame. However, these mounting assembly elements could be reversed. Thus, the mounting assembly element on the electronic circuit card could be either one of a key and a socket, and the mounting assembly element that is associated with the electronic equipment system could be the other of the key and the socket.

In a key/socket implementation, the key and the socket control a force to mount the electronic circuit card to the electronic equipment system. The key and the socket may also or instead control a force to dismount the electronic circuit card from the electronic equipment system and/or a contact force between the connector and the mating connector while the electronic circuit card is mounted to the electronic equipment system.

The second mounting assembly element is described above as being associated with the electronic equipment system. This is intended to convey the notion that the equipment-side mounting assembly element need not be part of a frame structure, rack, shelf, or other structural component of a piece of equipment. For example, where the electronic equipment system includes a frame structure to receive one or more electronic circuit cards, a rear module that is mountable on a rear side of the frame and is separable from the frame structure might include at least one of the mating connector and the second element of the mounting assembly. More generally, the equipment-side mounting assembly element might be part of a frame structure or a further component of an electronic system component that is separable from the frame structure. Mounting assembly elements could be provided on both a frame structure and one or more further components where multiple mounting assemblies are provided. The same component that carries a mounting assembly element might, but need not necessarily, also carry a connector.

Corresponding features may be provided in an electronic equipment system that receives one or more electronic circuit cards. Such a system might include a connector to operatively couple the electronic equipment system to an electronic circuit card, and a first element of a mounting assembly to engage a second element of the mounting assembly on the electronic circuit card to releasably mount the electronic circuit card to the electronic equipment system. The connector and the first element of the mounting assembly are positioned in the electronic equipment system to releasably hold the connector in an operative position relative to a mating connector of the electronic circuit card when the electronic circuit card is mounted to the electronic equipment system.

On the equipment system side, multiple mounting assembly elements could be provided for mounting each electronic circuit card. One or more mounting assemblies might also or instead be provided for respective electronic circuit cards where the system accommodates more than one card.

A complete equipment system might include both a base system such as a frame that receives one or more electronic circuit cards, as well as the electronic circuit card(s) mounted thereto.

Figure 11A:
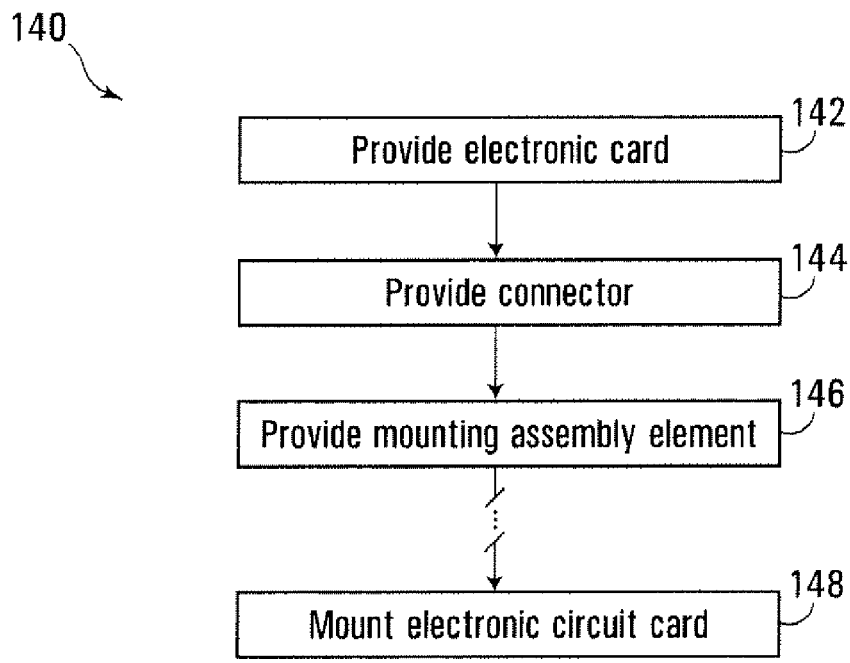
FIGS. 11A and 11B are flow diagrams of example methods according to further embodiments of the invention.
Figure 11B:
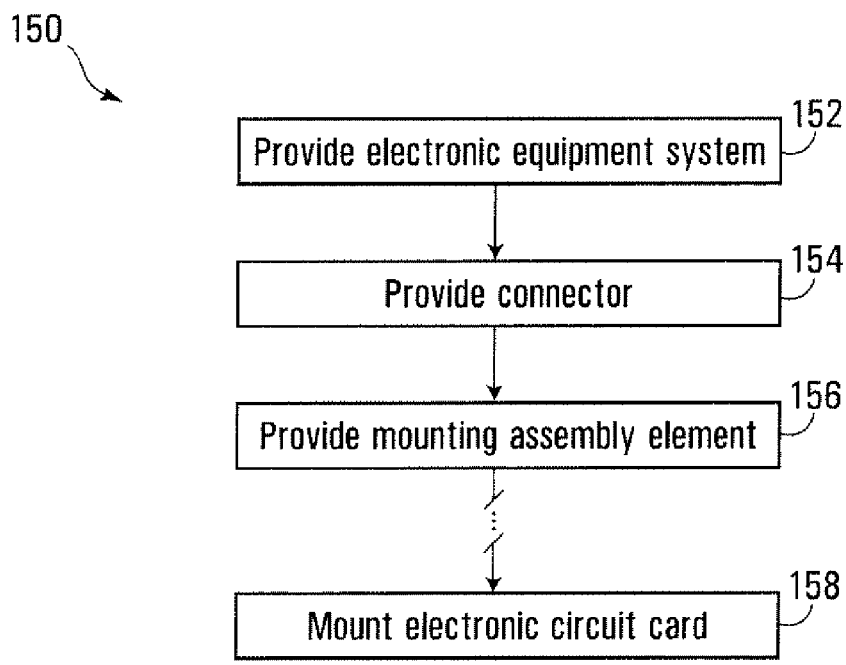

Aspects of the present invention may also or instead be embodied in methods, and the flow diagrams in FIGS. 11A and 11B illustrate examples of such methods.

The example method 140 in FIG. 11A includes an operation 142 of providing an electronic circuit card, an operation 144 of providing a connector on the electronic circuit card to operatively couple the electronic circuit card to an electronic equipment system, and an operation 146 of providing a first element of a mounting assembly on the circuit card to engage a second element of the mounting assembly associated with the electronic equipment system to releasably mount the electronic circuit card to the electronic equipment system. As described above, providing the connector at 144 and providing the first element of the mounting assembly at 146 may include positioning the connector and the first element of the mounting assembly on the electronic circuit card to releasably hold the connector in an operative position relative to a mating connector of the electronic equipment system when the electronic circuit card is mounted to the electronic equipment system. In some embodiments, the example method 140 may also include mounting the electronic circuit card to the electronic equipment system at 148. The mounting might occur some time after a card is manufactured, as indicated by the broken line between 146 and 148.

Considering the equipment side, the example method 150 in FIG. 11B involves providing an electronic equipment system at 152 to receive one or more electronic circuit cards, providing a connector in the electronic equipment system at 154 to operatively couple the electronic equipment system to an electronic circuit card, and providing a first element of a mounting assembly in the electronic equipment system at 156 to engage a second element of the mounting assembly on the electronic circuit card to releasably mount the electronic circuit card to the electronic equipment system. Providing the connector at 154 and providing the first element of the mounting assembly in the electronic equipment system at 156 involve positioning the connector and the first element of the mounting assembly in the electronic equipment system to releasably hold the connector in an operative position relative to a mating connector of the electronic circuit card when the electronic circuit card is mounted to the electronic equipment system.

In constructing an equipment installation, a method might also involve mounting the card to the system at 158, although not necessarily immediately after the equipment system is constructed.

It should be appreciated that these methods could vary substantially depending on the type of electronic circuit card or electronic equipment system that is being built. For instance, providing an electronic circuit card at 142 need not necessarily involve providing a fully operational circuit card prior to installing a mounting assembly element on the card at 146. An electronic equipment system similarly need not be fully operational before installation of its mounting assembly element(s) at 156. Additional operations may be performed subsequent to installation of mounting assembly elements. It should also be appreciated that the example methods need not necessarily be performed by the same entity. One entity might manufacture electronic circuit cards that are installed by another entity in an equipment system that is manufactured by a third entity, for example.

What has been described is merely illustrative of the application of principles of embodiments of the invention. Other arrangements and methods can be implemented by those skilled in the art without departing from the scope of the present invention.

For example, the contents of the drawings are intended solely for illustrative purposes, and the present invention is in no way limited to the particular example embodiments shown therein. Other embodiments may include further, fewer, and/or different components or operations than those explicitly shown and described.

Embodiments of the invention are also not limited to any particular types of electronic circuit cards. While the mounting assemblies and methods disclosed herein might be useful in conjunction with blind-mated fiber connectors, other types of circuit cards could benefit from improved mounting techniques.

Different embodiments might also use different materials, shapes, and/or sizes of sockets and keys. In one embodiment, a socket and key are made of metal. Other embodiments may use different materials, such as plastics, and a socket and a key of the same mounting assembly could potentially include different materials. Even a single socket or key could include multiple materials to achieve desired force characteristics.

We claim:

1. An electronic circuit card comprising:
   a connector to operatively couple the electronic circuit card to an electronic equipment system; and
   a first self-locking element of a mounting assembly to engage and releasably lock with a second self-locking element of the mounting assembly associated with the electronic equipment system, the first self-locking element when locked with the second self-locking element releasably mounting the electronic circuit card to the electronic equipment system,
   the connector and the first self-locking element of the mounting assembly being positioned on the electronic circuit card to releasably hold the connector in an operative position relative to a mating connector of the electronic equipment system when the electronic circuit card is mounted to the electronic equipment system.

2. The electronic circuit card of claim 1, wherein the electronic equipment system comprises a rack-mountable frame system to house and interconnect one or more electronic circuit cards.

3. The electronic circuit card of claim 1, wherein the connector comprises one or more optical connectors, one or more electrical connectors, or both one or more optical connectors and one or more electrical connectors.

4. The electronic circuit card of claim 1, further comprising:
   a first self-locking element of each of one or more additional mounting assemblies to engage a second self-locking element of each of the one or more additional mounting assemblies associated with the electronic equipment system.

5. The electronic circuit card of claim 1, wherein the mounting assembly comprises a self-locking key and a self-locking socket to receive the self-locking key, wherein one of the first self-locking element of the mounting assembly and the second self-locking element of the mounting assembly comprises the self-locking key, and wherein the other of the first self-locking element of the mounting assembly and the second self-locking element of the mounting assembly comprises the self-locking socket.

6. The electronic circuit card of claim 5, wherein the self-locking key and the self-locking socket control a force to mount the electronic circuit card to the electronic equipment system.

7. The electronic circuit card of claim 5, wherein the self-locking key and the self-locking socket control a force to dismount the electronic circuit card from the electronic equipment system.

8. The electronic circuit card of claim 5, wherein the self-locking key and the self-locking socket control a contact force between the connector and the mating connector while the electronic circuit card is mounted to the electronic equipment system.

9. The electronic circuit card of claim 1, wherein the first self-locking element comprises respective different structures to control an insertion force to lock the first self-locking element with the second self-locking element and a removal force to unlock the first self-locking element from the second self-locking element.

10. An electronic equipment system to receive one or more electronic circuit cards, the electronic equipment system comprising:
    a connector to operatively couple the electronic equipment system to an electronic circuit card; and
    a first self-locking element of a mounting assembly to engage and releasably lock with a second self-locking element of the mounting assembly on the electronic circuit card, the first self-locking element when locked with the second self-locking element releasably mounting the electronic circuit card to the electronic equipment system,
    the connector and the first self-locking element of the mounting assembly being positioned in the electronic equipment system to releasably hold the connector in an operative position relative to a mating connector of the electronic circuit card when the electronic circuit card is mounted to the electronic equipment system.

11. The electronic equipment system of claim 10, comprising a rack-mountable frame system to house and interconnect the one or more electronic circuit cards.

12. The electronic equipment system of claim 10, wherein the connector comprises one or more optical connectors, one or more electrical connectors, or both one or more optical connectors and one or more electrical connectors.

13. The electronic equipment system of claim 10, further comprising:
    a first self-locking element of each of one or more additional mounting assemblies to engage a second self-locking element of each of the one or more additional mounting assemblies on the electronic circuit card.

14. The electronic equipment system of claim 10, further comprising:
a first self-locking element of each of one or more additional mounting assemblies to engage a second self-locking element of each of the one or more respective additional mounting assemblies on one or more additional electronic circuit cards.

15. The electronic equipment system of claim 10, wherein the mounting assembly comprises a self-locking key and a self-locking socket to receive the self-locking key, wherein one of the first self-locking element of the mounting assembly and the second self-locking element of the mounting assembly comprises the self-locking key, and wherein the other of the first self-locking element of the mounting assembly and the second self-locking element of the mounting assembly comprises the self-locking socket.

16. The electronic equipment system of claim 15, wherein the self-locking key and the self-locking socket control a force to mount the electronic circuit card to the electronic equipment system.

17. The electronic equipment system of claim 15, wherein the self-locking key and the self-locking socket control a force to dismount the electronic circuit card from the electronic equipment system.

18. The electronic equipment system of claim 15, wherein the self-locking key and the self-locking socket control a contact force between the connector and the mating connector while the electronic circuit card is mounted to the electronic equipment system.

19. The electronic equipment system of claim 10, comprising:
a frame structure to receive the one or more electronic circuit cards; and
a further component of the electronic equipment system, the further component being separable from the frame structure,
wherein the frame structure or the further component comprises the first self-locking element of the mounting assembly.

20. The electronic equipment system of claim 10, further comprising:
the electronic circuit card.

21. A method comprising:
providing an electronic circuit card;
providing a connector on the electronic circuit card to operatively couple the electronic circuit card to an electronic equipment system; and
providing a first self-locking element of a mounting assembly on the circuit card to engage and releasably lock with a second self-locking element of the mounting assembly associated with the electronic equipment system, the first self-locking element when locked with the second self-locking element releasably mounting the electronic circuit card to the electronic equipment system,
wherein providing the connector and providing the first self-locking element of the mounting assembly comprise positioning the connector and the first self-locking element of the mounting assembly on the electronic circuit card to releasably hold the connector in an operative position relative to a mating connector of the electronic equipment system when the electronic circuit card is mounted to the electronic equipment system.

22. The method of claim 21, wherein the mounting assembly comprises a self-locking key and a self-locking socket to receive the self-locking key, and wherein providing the first self-locking element of the mounting assembly comprises providing one of the self-locking key and the self-locking socket on the electronic circuit card.

23. The method of claim 21, further comprising:
mounting the electronic circuit card to the electronic equipment system.

24. A method comprising:
providing an electronic equipment system to receive one or more electronic circuit cards;
providing a connector in the electronic equipment system to operatively couple the electronic equipment system to an electronic circuit card; and
providing a first self-locking element of a mounting assembly in the electronic equipment system to engage and releasably lock with a second self-locking element of the mounting assembly on the electronic circuit card, the first self-locking element when locked with the second self-locking element releasably mounting the electronic circuit card to the electronic equipment system,
wherein providing the connector and providing the first self-locking element of the mounting assembly comprise positioning the connector and the first self-locking element of the mounting assembly in the electronic equipment system to releasably hold the connector in an operative position relative to a mating connector of the electronic circuit card when the electronic circuit card is mounted to the electronic equipment system.

25. The method of claim 24, wherein the mounting assembly comprises a self-locking key and a self-locking socket to receive the self-locking key, and wherein providing the first self-locking element of the mounting assembly comprises providing one of the self-locking key and the self-locking socket on the electronic equipment system.

26. The method of claim 24, further comprising:
mounting the electronic circuit card to the electronic equipment system.

* * * * *